US008552737B2

(12) United States Patent
Blank et al.

(10) Patent No.: US 8,552,737 B2

(45) Date of Patent: Oct. 8, 2013

(54) HIGH-VOLTAGE TRANSFORMER

(75) Inventors: Rudolf Blank, Sulz (AT); Stefan Baldauf, Rankwell (AT)

(73) Assignee: B2 Electronic GmbH, Klaus (AT)

( * ) Notice: Subject to any disclaimer, the term of this patent is extended or adjusted under 35 U.S.C. 154(b) by 172 days.

(21) Appl. No.: 13/039,612

(22) Filed: Mar. 3, 2011

(65) Prior Publication Data

US 2011/0148433 A1 Jun. 23, 2011

Related U.S. Application Data

(63) Continuation of application No. PCT/EP2009/006388, filed on Sep. 3, 2009.

(30) Foreign Application Priority Data

Sep. 5, 2008 (DE) ........................ 10 2008 045 846

(51) Int. Cl.
*G01R 31/06* (2006.01)

(52) U.S. Cl.
USPC ............ 324/547; 324/429; 324/663; 336/58; 174/15.1

(58) Field of Classification Search
USPC .................. 336/145, 58; 324/547; 174/15.1
See application file for complete search history.

(56) References Cited

U.S. PATENT DOCUMENTS

| | | | | |
|---|---|---|---|---|
| 2,440,556 | A * | 4/1948 | Paluev | 336/57 |
| 2,748,356 | A * | 5/1956 | Kaehni | 336/58 |
| 3,371,299 | A * | 2/1968 | Radkowski et al. | 336/57 |
| 3,564,472 | A | 2/1971 | Frowein | |
| 3,996,512 | A * | 12/1976 | Baur | 324/533 |
| 4,983,859 | A * | 1/1991 | Nakajima et al. | 307/419 |
| 7,023,312 | B1 * | 4/2006 | Lanoue et al. | 336/60 |
| 7,161,456 | B2 * | 1/2007 | Knox | 336/90 |

FOREIGN PATENT DOCUMENTS

| | | |
|---|---|---|
| CH | 470738 | 3/1969 |
| DE | 714480 | 11/1941 |
| DE | 50687 | 10/1966 |
| DE | 1226119 | 10/1966 |

OTHER PUBLICATIONS

English translation of the International Search Report issued Dec. 30, 2009, for corresponding International Application No. PCT/EP2009/006388.

* cited by examiner

*Primary Examiner* — Richard Isla Rodas

(74) *Attorney, Agent, or Firm* — Myers Wolin, LLC

(57) ABSTRACT

A high-voltage transformer for providing an alternating voltage in the kV range, comprising at least one secondary winding wound on a coil carrying body surrounding a transformer core, and an insulation housing encapsulating the secondary winding is provided to electrically insulate the secondary winding. Said insulation housing is walled by the coil carrying body carrying the secondary winding and by an enveloping body made of plastic and enveloping the secondary winding so that an annular gap is formed, wherein the annular gap between the secondary winding and the enveloping body is filled with an insulating fluid. The annular gap has a gap width of less than or equal to 20 mm viewed in the cross-section, and the enveloping body has a wall thickness of less than or equal to 20 mm, wherein the plastic is polypropylene, and a separate expansion volume is not provided for the insulating fluid.

11 Claims, 3 Drawing Sheets

HIGH-VOLTAGE TRANSFORMER

CROSS-REFERENCE TO RELATED APPLICATIONS

This is a continuation of PCT/EP2009/006388 filed on Sep. 3, 2009, which claims priority to DE 10 2008 045 846.5 filed on Sep. 5, 2008, the contents of each of which are incorporated herein by reference.

FIELD OF THE INVENTION

The present invention relates to a high-voltage transformer for supplying an a.c. voltage in the kV range, with at least one secondary winding, which is wound on a coil support surrounding the transformer core.

BACKGROUND

Such high-voltage transformers are adequately known from the prior art. They are frequently parts of a test or measuring instrument, which may be mobile, in which the high voltage that can be tapped on at least one secondary winding is used as the test voltage for a component to be tested or for other measurement purposes.

In this process, an input a.c. voltage is applied to a primary winding of the transformer, which winding surrounds a ferromagnetic core of the transformer, which core is composed, for example, of iron or a laminated iron assembly. The magnetic field induced thereby in the transformer core then in turn induces, in the at least one secondary winding, a secondary voltage whose amplitude depends substantially on the ratio of the respective number of turns of the primary and secondary windings. In the high-voltage range of relevance here, particular care is advisable in connection with the electrical insulation of the transformer or of the secondary winding.

There exist high-voltage transformers of the type mentioned in the introduction with exactly one secondary winding, whose output a.c. voltage relative to ground signal is tapped. There are also known high-voltage transformers with in total two secondary windings, each delivering an output voltage phase-shifted by 180° relative to one another. In the case of secondary windings of identical configuration, it is therefore possible, by tapping the differential voltage, to achieve doubling of the maximum voltage than can be tapped on one secondary winding. Thus each of the secondary windings has to be designed only for a smaller output voltage, or for half of the output voltage in the case of identical constructions. However, it is expressly pointed out that the present invention is not limited to a particular transformer arrangement or geometry.

A coil support such as known from the prior art, supporting the secondary winding and made from electrically insulating material, insulates the secondary winding from the transformer core on the radially inward side relative to the coil geometry. For this purpose the coil support is advantageously provided with a central bore, through which, for example, one leg of the transformer core is passed. In the prior art, essentially two different insulation concepts are known for further electrical insulation of the secondary winding, which for its part frequently already comprises insulated wires.

In a first variant, known as dry transformers, the secondary winding is potted by means of a casting resin, which once cured provides adequate electrical insulation of the secondary winding toward the outside also. However, small defects (such as air inclusions or vacuum voids, if casting took place under vacuum conditions) in the dried casting resin may lead, as a result of voltage breakdown, to destruction, usually irreparable, of the transformer. In view of the high viscosity of the casting resins known in the prior art, great expense is needed to manufacture such dry transformers with the minimum possible reject percentage.

A further consideration is that it would be desirable to use thin winding wires for the secondary windings of novel high-voltage transformers, but this is not compatible with the high viscosity of the casting resin. Specifically, the casting resin is then no longer capable of closing, with adequate safety, any gaps that may be present between adjacent wires without forming defects. In the case of dry transformers, therefore, "preimpregnation" of the winding with a more fluid insulating medium is occasionally used even before the winding is potted in the resin. In this case also, however, the danger of undesired defects is very great, as is the manufacturing time and effort that must be expended to prevent such defective insulations. Dry transformers therefore rely mostly on relatively large wire diameters for the secondary winding.

Particularly in the use of high-voltage transformers of the type mentioned in the introduction in mobile test or measuring instruments, the total weight of the test or measuring instrument, determined substantially by the weight of the transformer, is an important criterion.

In the case of dry transformers of the aforesaid type, the casting resin already represents a not inconsiderable contribution to the total weight of the transformer, because of the layer thickness necessary for high-voltage insulation purposes and because of its density, which is usually in the range of approximately 1.3 to 1.7 g/cm$^3$. The use of relatively thick wires for the secondary winding(s) also contributes disadvantageously to the weight of a dry transformer.

A second variant of high-voltage transformers uses, for insulation purposes, an insulating fluid, which surrounds the entire transformer within a transformer housing made of metal. In this case there is usually used an insulating oil, or else—frequently under pressure—an insulating gas (such as sulfur hexafluoride ($SF_6$)).

In this case the entire transformer including transformer core and coil is surrounded by insulating oil. Because of the not inconsiderable thermal expansion of the insulating oil during operation of the transformer, or if the ambient temperature is high for other reasons, such oil-insulated transformers, if they are not used as stationary devices with continuous and cooled oil circulation, must provide a special expansion volume (for example, in the form of an expansion vessel), into which the insulating oil can expand as needed, as is the case, for example, in the oil transformer according to DE 1226119. The oil volume surrounding the entire transformer contributes substantially to the total weight of such a transformer, as does the weight of the metal housing.

Further oil transformers are known from CH 470738 and DE 714480, but they also include means for providing a separate expansion volume.

SUMMARY

Against this background, it is the object of the present invention to improve a high-voltage transformer of the type mentioned in the introduction to the effect that, from the viewpoints of weight savings and simultaneously simpler, more cost effective and more reliable design, it is superior to the high-voltage transformers known from the prior art.

In the inventive high voltage transformer it is intended as a supplement to the features mentioned in the introduction that it is provided with an insulating housing encapsulating the secondary winding for electrical insulation of the secondary winding, which housing is walled, on the radially inward side relative to the coil geometry, by the coil support carrying the secondary winding and, on the radially outward side relative to the coil geometry, by a shell structure made of plastic and surrounding the secondary winding while forming an annular gap, wherein the angular gap between secondary winding and shell structure is filled with an insulating fluid.

In this connection it is self-evident that the insulating housing for the inventive encapsulation of the secondary winding must also be closed in axial direction, or in other words on the mutually opposite end faces of the insulating housing. To ensure the necessary contacting (on the low-voltage and high-voltage sides) of the secondary winding, the insulating housing must also have suitable penetrations or openings, which are to be closed off or packed in suitable fluid-tight manner.

By the fact that the insulating housing provided according to the invention encapsulates the secondary winding while forming an outer annular gap filled with insulating fluid, the volume of insulating fluid used for insulating purposes, especially insulating oil, can be greatly reduced compared with the high-voltage transformers known from the prior art, in which the entire transformer including transformer core is mounted in insulating oil. This is a first contribution to a weight savings achieved within the scope of the present invention. Furthermore, because of the fact that an annular gap filled completely with insulating fluid surrounds the secondary winding in the shell structure, this shell structure, made of plastic, can be manufactured with a considerably thinner wall thickness than is necessary for the purposes of adequate high-voltage insulation in the case of the resin jacket of a dry transformer potted in casting resin in the region of the secondary winding. And, finally, the shell structure of the insulating housing provided according to the invention can be injection-molded simply and inexpensively from plastic, without the need for particularly great time and effort to avoid defects, as is the case in potting a secondary winding in casting resin. After the secondary winding has been wound onto the coil support, the shell structure is simply slipped over the secondary winding and closed off hermetically, or in other words fluid-tightly at the end faces to form an insulating housing. The annular gap is filled with insulating fluid via a suitable opening (which will subsequently be closed off) in the insulating housing.

The fact that the insulating fluid present in the annular gap has greater fluidity than casting resin and does not harden makes it possible in simple manner to achieve defect-free electrical insulation of the secondary winding, even for small wire diameters of the secondary winding.

By the use of an insulating fluid, or in other words a non-hardening insulating oil or an insulating gas, it is also possible in particularly advantageous manner to use particularly thin wires for the secondary winding, thus permitting a further weight reduction, especially in comparison with conventional dry transformers.

In other respects it proves particularly advantageous that the encapsulation of the secondary winding by the insulating housing is achieved on the radially inward side by the coil support and on the radially outward side by the shell structure, which surrounds the annular gap filled with insulating oil. Advantageously, therefore, the transformer core or further components of the transformer is or are not directly in contact with the insulating fluid, and this is conducive to ensuring that the insulating fluid used remains clean as long as possible. In the prior art, where the ferromagnetic transformer core of oil-insulated transformers is always also in direct contact with insulating oil, the insulating oil becomes steadily and increasingly contaminated (especially also with conductive particles), with the consequence that it must be regularly replaced or cleaned. By comparison, the insulating fluid of an inventive high-voltage transformer either may not have to be replaced at all over the useful life of the transformer, or may have to be replaced only after longer operating intervals. Moreover, it has been shown that, as a result of the encapsulation by means of a plastic shell structure and as a result of the much smaller volume of insulating oil by comparison with the prior art, there is no need to provide a separate expansion volume for the insulating oil, thus representing a further advantage compared with other oil-insulated transformers from the prior art.

Finally, the shell structure or the insulating housing, which preferably surrounds the secondary winding closely while forming an annular gap, has distinctly reduced weight by comparison with previously known metal housings for oil-insulated transformers, both because of its smaller dimensions and because of the choice of different material.

Obviously a suitable cooling mechanism can be provided if necessary, especially when an inventive high-voltage transformer is installed in a mobile test or measuring instrument, in order to counteract any excessive heat development during operation of the transformer. Especially in the case of mobile test or measuring instruments of the type discussed hereinafter, however, the requirements for such a cooling mechanism remain within reason, since, for example, the provision of a test voltage of 75 kV rms can already be achieved with battery-operated or accumulator-operated test instruments at a power of only 12 to 15 watt. Here also, however, it is fair to say that the present invention is not to be limited to specific power ranges of the transformer or test/measuring instrument, even though one application of the inventive teaching for test or measuring instruments is preferably provided with a maximum test or measuring voltage of (at least) 75 kV rms (preferably even 100 or else even 200 kV rms) with powers in the range of a few watt up to 100, 200 or even 300 watt.

As a result, the present invention provides a distinctly more lightweight high-voltage transformer, which can be manufactured more simply and less expensively and which is suitable in particular for mobile applications.

On principle it must be pointed out that the high-voltage insulation for the secondary winding is provided in outward direction both by the insulating fluid present in the annular gap and by the shell structure. It is apparent, however, that even an annular gap with a relatively narrow gap width (meaning a smaller volume of insulating oil) is sufficient in the scope of the present invention for adequate insulation of a high voltage in the kV range—with simultaneously relatively thin wall thickness of the shell structure (see hereinafter). The annular gap, filled with insulating fluid, around the secondary winding therefore has a gap width, according to the invention, of smaller than or equal to 20 mm considered in cross section, and even more preferably smaller than or equal to 10 mm. For sufficient insulation of a.c. voltages up to approximately 40 kV rms (root-mean-square voltage) at the secondary winding in question, even a gap width of approximately 3 mm—with correspondingly small need for insulating oil, and in conjunction with the insulating characteristics of a plastic shell structure having a wall thickness on the order of approximately 5 mm—is suitable. In this case, a constant gap width is preferably maintained over the entire length of the secondary winding and, within the cross section, over the entire length of the annular gap. By comparison with conventionally oil-insulated high-voltage transformers for mobile test instruments, the volume of insulating oil needed can be reduced by up to 90% in this way, which is obviously associated with a particularly distinct weight reduction.

It is further provided according to the invention that the shell structure has a wall thickness of smaller than or equal to 20 mm, even more advantageously smaller than or equal to 10 mm, even smaller than or approximately equal to 5 mm. This proves—especially in conjunction with the already mentioned width of the annular gap for the insulating fluid—to be adequate for the desired insulating fluid at high voltages in the range of several tens to a few hundred kV, and in turn permits a considerable weight savings compared with the prior art, especially by comparison with conventional dry transformers. For mobile test or measuring instruments that provide a voltage of up to 200 kV rms—distributed to two secondary windings with separate insulating housings—it is already possible to achieve sufficient insulation by the insulating housing with a wall thickness of approximately 15-20 mm for the insulating housing and an annular gap width of approximately 20 mm. At lower voltages, the cited values for the wall thickness of the shell structure or the width of the annular gap can be correspondingly reduced.

Within the scope of the invention, polypropylene is used as plastic for the shell structure or the insulating housing, since it is particularly suitable for the present invention, especially because of its good insulating characteristics and its low density of approximately 0.97 g/cm$^3$.

In a first preferred configuration of the present invention, an insulating-fluid filling nozzle, which can be hermetically closed off and through which the insulating fluid can be filled into the annular gap surrounding the secondary winding, is provided on the insulating housing. This is obviously formed preferably on the shell structure radially surrounding the secondary winding, in which case it may also be practical to dispose it on one end face. The insulation fluid is filled through the filling nozzle before startup of the transformer. Furthermore, it may also be preferable to ensure that the insulating fluid can also be drained through the filling nozzle if necessary and replaced by a new insulating fluid. Especially in the case of use of an insulating oil, filling preferably takes place under vacuum or reduced-pressure conditions, so that it can be guaranteed that the annular gap present inside the insulating housing will be filled completely with insulating oil. In the case of use of an insulating gas, this may also be pumped at a certain overpressure into the insulating housing in order to achieve an adequate insulating effect, in which case sufficient overpressure resistance of the insulating housing, especially of the shell structure, must be ensured.

The filling nozzle may also be formed preferably on one of the openings of the insulating housing through which the lead of the secondary winding on the low-voltage or high-voltage side is led out of the housing.

With regard to a geometry of the insulating housing that can be achieved particularly simply and to a particularly uniform pressure distribution through the insulating oil if it expands (slightly) within the annular gap during operation of the transformer, it is provided in a preferred improvement of the invention that the shell structure has substantially tubular shape. This also permits—especially when the geometry of the secondary winding is substantially circular in cross section—a particularly compact and stable structural shape of the insulating housing. However, it must be pointed out once again that the present invention is generally not limited to a special cross-sectional geometry of the transformer core or of the secondary winding.

A further preferred embodiment of the present invention provides that the secondary winding is made of a wire with a diameter of smaller than or equal to 0.2 mm or smaller than or equal to 0.1 mm. Obviously the wire should already be provided with its own insulation, for example in the form of lacquer insulation. Because of the inventive configuration of the claimed high-voltage transformer, it is even possible, in a particularly preferred manner, to use even thinner winding wires with diameters of smaller than or equal to 0.05 mm, especially wires with a diameter of approximately 0.04 mm. Such wires—already with one or two coats of lacquer insulation—are commercially available. They can be wound around the coil support with winding techniques known from the prior art, for example in multilayer windings or disk windings or with other winding methods.

In this connection, secondary windings with more than or equal to 50,000, 100,000 or even 150,000 turns are preferably formed for generation of the desired a.c. voltage in the kV range.

In yet another preferred improvement of the present invention, it is provided that the coil support and the shell structure are made from the same plastic. This proves to be advantageous in particular when these are welded together at the end faces in order to form the inventive encapsulation for the secondary winding. To close off the insulating housing at the end faces, it is possible to provide radially extending rims, which are welded to the respective other component for hermetic sealing of the housing, on the coil support and/or shell structure, which otherwise extend axially. Alternatively, however, it is also possible to use separate end caps, which will be disposed at the end faces between coil support and shell structure, which are also made of the same plastic if necessary and which are welded together with the coil support and shell structure to achieve fluid-tight encapsulation of the secondary winding plus insulating fluid, or which are packed against these by means of suitable sealing elements.

Insulating oils known for this purpose from the prior art are preferably used as insulating fluid. Compared with an insulating gas, which is actually to be preferred for weight reasons, the advantage is then achieved that this does not have to be filled into the insulating housing under overpressure, and so the structural requirements imposed on the insulating housing are less stringent.

Besides the high-voltage transformer as such, the present invention also comprises in particular a mobile, and in other words especially a portable test or measuring instrument with a test or measuring instrument housing and a high-voltage transformer of the type described in the foregoing disposed within the test or measuring instrument housing. The advantages described in the foregoing, especially the weight reduction compared with previously known transformers, are particularly marked here. In test instruments of this type, either accumulator power or a separate voltage supply via a suitable lead is provided.

In a particular improvement of such a test instrument, it is provided in the scope of the present invention that the test instrument is a high-voltage test instrument for testing the breakdown strength of insulating oils or other materials under test, wherein the high-voltage transformer is suitable for providing a secondary voltage, functioning as a test voltage, of several tens of kV, especially of up to or at least 75, 100 or even 200 kV rms (root-mean-square voltage). In the case of testing for the breakdown strength of insulating oils, a suitable test chamber is to be provided for the insulating oil to be tested. Advantageously, two secondary windings are provided for this purpose. As already mentioned in the introduction, this is advantageously an arrangement in which the secondary windings deliver output voltages phase-shifted by 180° relative to one another, the tapped differential voltage being used as the test voltage for testing the breakdown strength of the insulating oils to be tested and disposed within the test chamber. Since the currents to be passed through the secondary winding for this purpose are not particularly high, it is possible to use, especially in this application, particularly thin wires (see hereinabove) for the secondary winding.

Heretofore such test instruments with accumulator operation and high-voltage transformers known from the prior art (including accumulator and all other components of the test instrument) were available exclusively with a total weight of greater than 25 kg. It is only within the scope of the present invention that it has become possible to reduce their weight or mass to less than or equal to 25 kg. The main reason for the achievement of such a lightweight test instrument to provide voltages higher than or equal to 75 kV rms is the lightweight high-voltage transformer, which (including primary and secondary windings, transformer core and insulating housing plus insulating oil) contributes a weight of less than 7.5 kg (even as little as 6.5 kg in a preferred variant) to the total weight of the test instrument. This weight reduction proves to be extremely important in particular because occupational safety regulations in many countries impose a weight limit for mobile instruments, so that they can be carried by one person.

Since the transformer of such a test instrument has two secondary windings, it is in turn advantageous for weight reasons that each secondary winding is encapsulated by a separate insulating housing within the meaning of the present invention.

BRIEF DESCRIPTION OF THE DRAWINGS

An exemplary embodiment of the present invention will be explained in more detail hereinafter with reference to the drawing, wherein.

DETAILED DESCRIPTION

Figure 1:
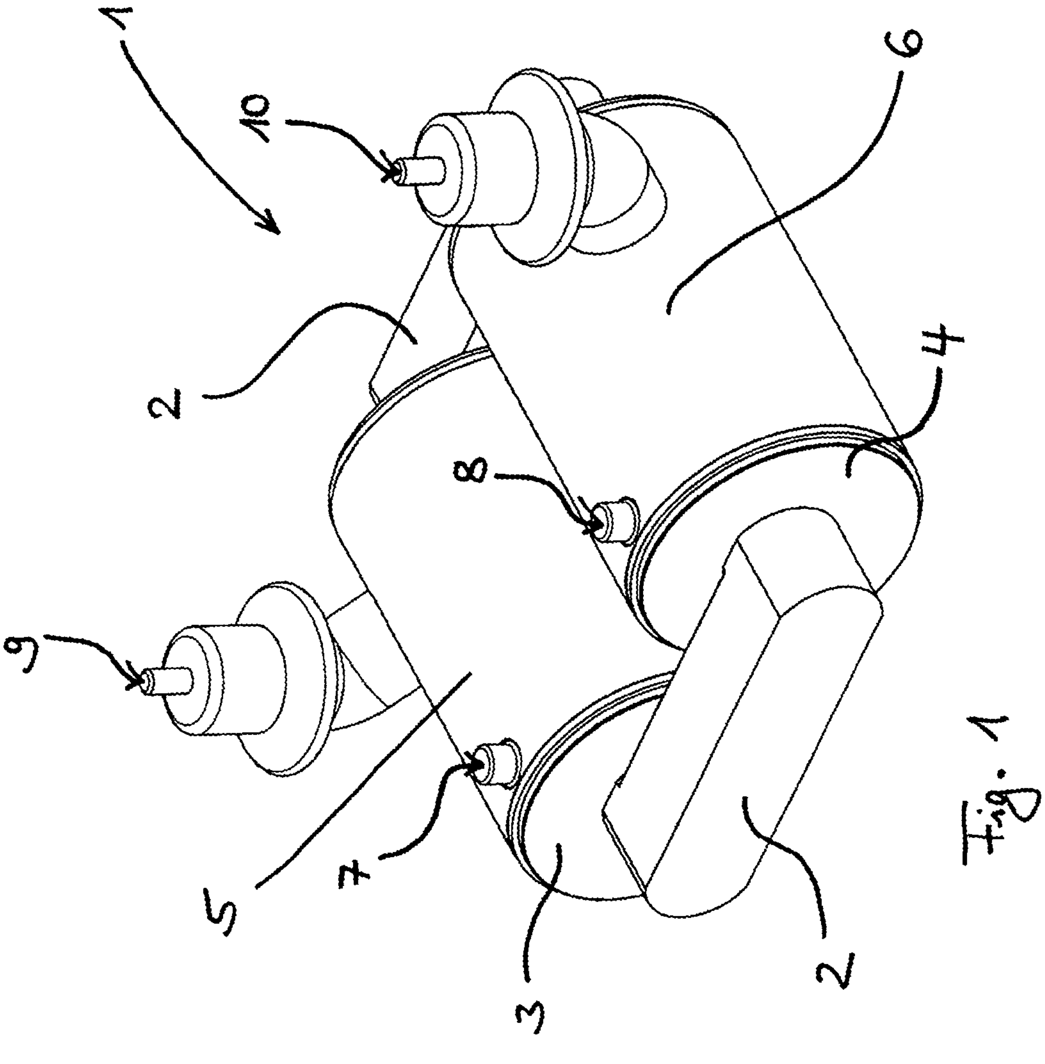
FIG. 1 shows a perspective view of the main components of an exemplary embodiment of an inventive high-voltage transformer.

High-voltage transformer 1 illustrated in FIG. 1 comprises a ferromagnetic transformer core 2, around which there are wound, in the present case, two primary windings 3, 4 (formed as disk windings and separately insulated) on different legs.

Furthermore, FIG. 1 shows two insulating housings 5, 6, each surrounding one leg of transformer core 2, each providing a lead 7, 8 on the low-voltage side and a lead 9, 10 on the high-voltage side for secondary winding 12 disposed in the respective insulating housing 5, 6. All leads 7, 8, 9, 10 are formed such that they can be contacted with the corresponding end of the secondary winding or such that corresponding contacting can be routed through them.

Figure 2:
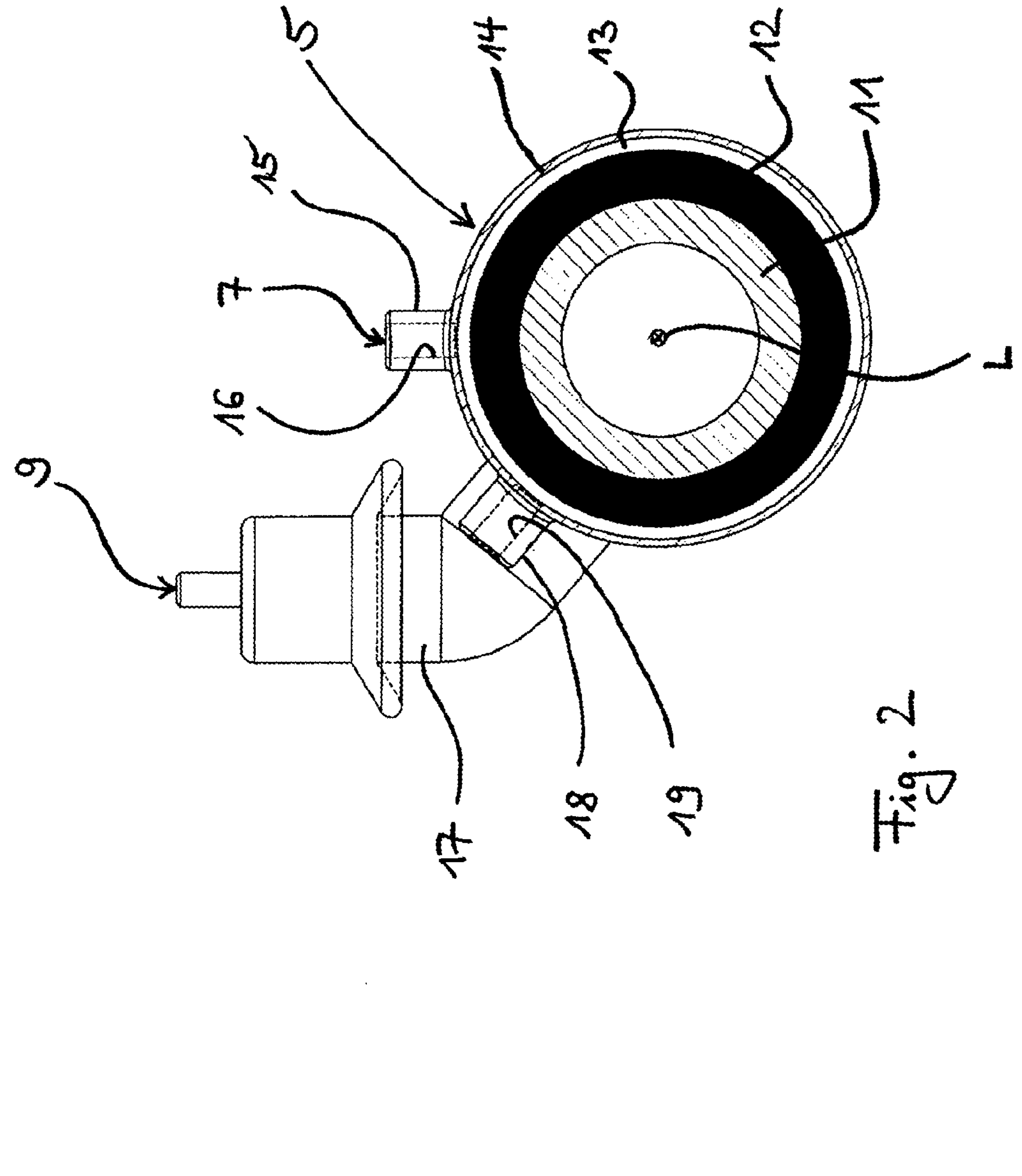
FIG. 2 shows a section through an insulating housing of the high-voltage transformer of FIG. 1.

The exact structure of insulating housing 5, which is structurally identical to second insulating housing 6, can be seen from the section in FIG. 2, which is oriented perpendicular to longitudinal axis L of insulating housing 5 and for reasons of better clarity is shown in two section planes, one through lead 7 on the low-voltage side and the other through lead 9 on the high-voltage side.

Within the section plane, insulating housing 5 is bounded or walled on the radially inward side by a coil support 11 made of plastic, which in turn surrounds a leg—not illustrated in FIG. 2—of transformer core 2. Secondary winding 12 is wound by means of a suitable winding method on coil support 11, wherein secondary winding 12—while forming an annular gap 13—is surrounded by a shell structure 14, which is also made of plastic and is substantially tubular, and which represents the radially outer wall of insulating housing 5.

Annular gap 13 will be or is filled with an insulating oil.

Lead 7 for the low-voltage side of secondary winding 12 is made in the form of a nozzle 15 having a central opening 16, so that it can be used simultaneously as an insulating-oil filling nozzle, for which purpose annular gap 13 is filled with insulating oil through opening 16 under reduced-pressure conditions. The low-voltage side of secondary winding 12 is contacted through opening 16, and lead 7 or its opening 16 is packed in a suitable way before startup of transformer 1, or in other words after annular gap 13 has been completely filled with insulating oil.

In an analogous manner, lead 9 on the high-voltage side is also provided on insulating housing 5, under a protective sheath 17, with a corresponding nozzle 18, which is again equipped with a central opening 19 directed toward the inside of the shell structure. Here also the electrical contacting of the end of secondary winding 12 on the high-voltage side takes place through opening 19, which is then to be sealed or packed in a suitable manner. This nozzle 18 also may be used for filling annular gap 13 with insulating oil.

Obviously insulating housing 5 is also closed off in completely fluid-tight manner at both end faces, or in other words both in the direction of adjacent primary winding 3 (see FIG. 1) and at the opposite end, so that ultimately secondary winding 12 and the insulating oil surrounding secondary winding 12 within annular gap 13 are completely encapsulated. Under these conditions the insulating oil does not come into contact with transformer core 2.

Shell structure 14 and coil support 11 are made from the same plastic.

Figure 3:
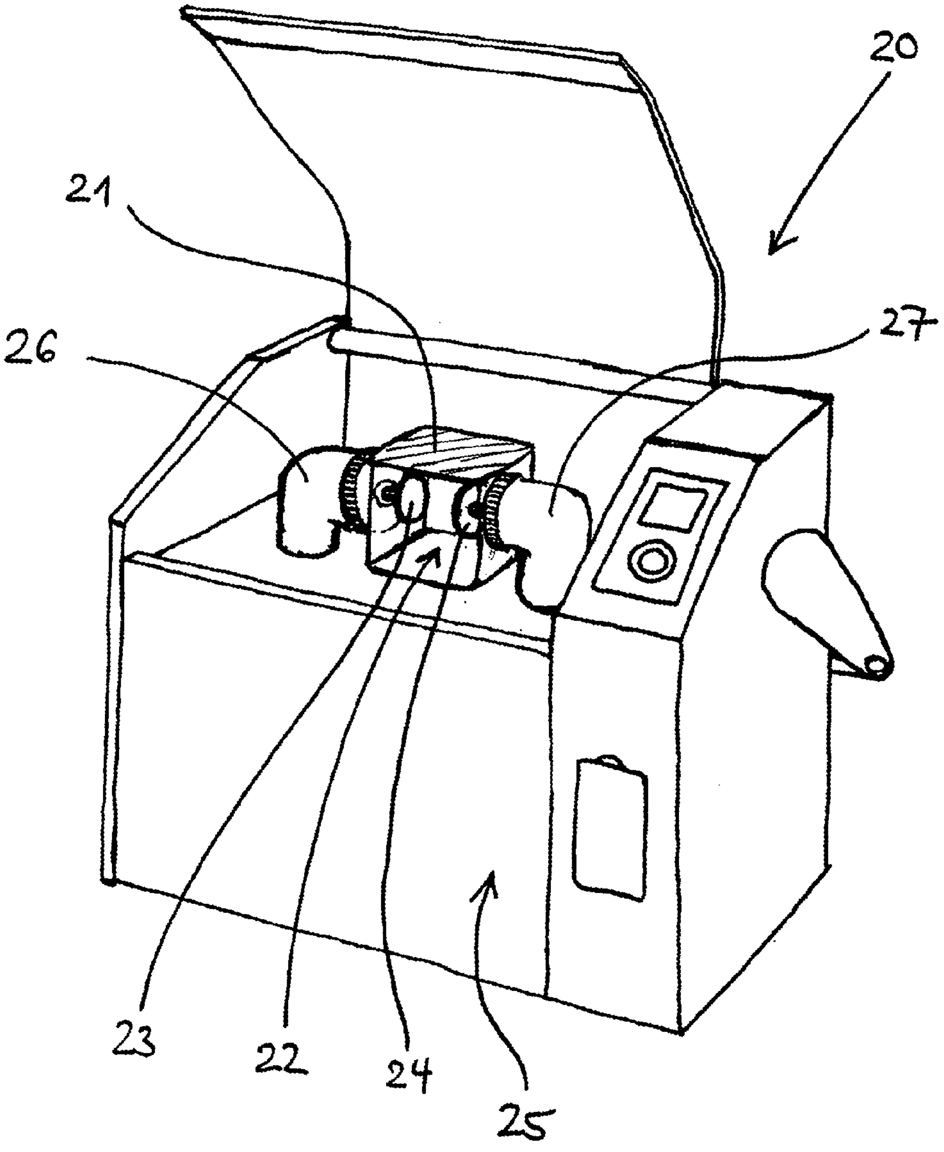
FIG. 3 shows a perspective view of an exemplary embodiment of an inventive test instrument, within the test instrument housing of which the high-voltage transformer of FIG. 1 is disposed.

Finally, FIG. 3 further shows a mobile, or in other words portable high-voltage test instrument 20 for testing the breakdown strength of insulating oils. For this purpose, test instrument 20 is provided with a test chamber 22, which is surrounded by a transparent housing and can be closed off with a cover 21, and which can be filled with the insulating oil to be tested. Two high-voltage electrodes 23, 24 facing one another are disposed inside test chamber 22, and a test voltage of 75 kV rms is applied to one of them.

The test voltage is applied by means of a high-voltage transformer 1, as illustrated in FIGS. 1 and 2, mounted inside test instrument housing 25. For this purpose the two high-voltage electrodes 23, 24 are each contacted with one of the two high-voltage outputs 9, of the high-voltage transformer. For this purpose there are used—suitably insulated—lead elements 26, 27, which extend into test instrument housing 25.

We claim:

1. A high-voltage transformer (1) for supplying a.c. voltage in the kV range, with at least one secondary winding (12), which is wound on a coil support (11) surrounding a transformer core (2), comprising:

an insulating housing (5, 6) encapsulating the secondary winding (12) for electrical insulation of the secondary winding (12), which insulated housing is walled by the coil support (11) carrying the secondary winding (12) and by a shell structure (14) made of plastic and surrounding the secondary winding (12) while forming an annular gap (13), wherein the annular gap (13) between secondary winding (12) and shell structure (14) is filled with an insulating fluid, wherein the annular gap (13) filled with insulating fluid has a gap width of smaller than or equal to 20 mm considered in cross section, wherein the shell structure (14) has a wall thickness of smaller than or equal to 20 mm, wherein the plastic is polypropylene, and wherein no separate expansion volume is provided for the insulating fluid.

2. A high-voltage transformer (1) according to claim 1, wherein the insulating housing (5, 6) is provided with an insulating-fluid filling nozzle (15, 18), which can be hermetically closed off and through which the insulating fluid is filled into the annular gap (13) surrounding the secondary winding (12) within the insulating housing (5, 6).

3. A high-voltage transformer (1) according to claim 1, wherein the shell structure (14) has a substantially tubular shape.

4. A high-voltage transformer (1) according to claim 1, wherein the secondary winding (12) is made of a wire with a diameter of smaller than or equal to 0.2 mm.

5. A high-voltage transformer (1) according to claim 4, wherein the secondary winding (12) comprises more than or equal to 50,000 turns.

6. A high-voltage transformer (1) according to claim 1, wherein the coil support (11) is made from the same plastic as the shell structure (14) and is welded thereto at its end faces.

7. A high-voltage transformer (1) according to claim 1, wherein the insulating fluid is an insulating oil.

8. A mobile test or measuring instrument (20) with a test or measuring instrument housing (25) and a high-voltage transformer (1) according to claim 1 disposed within the test or measuring instrument housing (25).

9. A mobile test instrument (20) according to claim 8, wherein the test instrument is a high-voltage test instrument for testing the breakdown strength of an insulating material under test, wherein the high-voltage transformer (1) is suitable for providing a secondary voltage, functioning as a test voltage, of several tens of kV rms (root-mean-square voltage).

10. A mobile test instrument (20) according to claim 9, wherein every secondary winding (12) of the high-voltage transformer is insulated by means of a separate insulating housing (5, 6).

11. A mobile test instrument (20) according to claim 8, wherein the test instrument (20) does not exceed a total weight of 25 kg.

* * * * *